(12) United States Patent
Kewariwal et al.

(10) Patent No.: US 7,106,132 B1
(45) Date of Patent: Sep. 12, 2006

(54) FEED-FORWARD OPERATIONAL AMPLIFIERS AND METHODS OF USING THE SAME

(75) Inventors: Muari Kewariwal, Austin, TX (US); Ammisetti Prasad, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 52 days.

(21) Appl. No.: 10/974,339

(22) Filed: Oct. 27, 2004

(51) Int. Cl.
    *H03F 3/68* (2006.01)
(52) U.S. Cl. .................. 330/144; 330/150; 330/151
(58) Field of Classification Search .......... 330/9, 330/107, 129, 151, 310
    See application file for complete search history.

(56) References Cited

U.S. PATENT DOCUMENTS 4,059,808 A * 11/1977 Sakamoto et al. ............ 330/257
6,466,091 B1 * 10/2002 Kejariwal et al. ........... 330/144

OTHER PUBLICATIONS

Thomsen et al., A Five Stage Stabilized Instrumentation Amplifier Using Feedforward Compensation, 1998 Symposium on VLSI Circuits.
Thomsen, Design of Multistage Feedforward Compensated Opamps, IEEE 2001.
Thomsen et al., A 110dB THD, 18mW DAC Using Output Sampling and Feedback to Reduce Distortion, 1999 IEEE Intenational Solid State Circuits Conference.
Thomsen et al., A DC Measurement IC with 130nVpp Noise in 10Hz, 2000 IEEE International Solid State Circuits Conference.

* cited by examiner

*Primary Examiner*—Robert Pascal
*Assistant Examiner*—Hieu Nguyen
(74) *Attorney, Agent, or Firm*—James J. Murphy; Thompson & Knight LLP (57) ABSTRACT

A feed-forward operational amplifier including a dedicated summer circuit for summing a signal generated by a first amplifier stage of a feed-forward amplifier and a signal received from an external source to generate a sum signal and a second amplifier stage coupled to the summer circuit and receiving the sum signal. The second amplifier stage realizes a pole-zero doublet to decrease a unity gain frequency of the feed-forward operational amplifier.

20 Claims, 6 Drawing Sheets

FEED-FORWARD OPERATIONAL AMPLIFIERS AND METHODS OF USING THE SAME

FIELD OF INVENTION

The present invention relates in general to linear circuits, and in particular, to feed-forward operational amplifiers and methods of using the same.

BACKGROUND OF INVENTION

Precision instrumentation systems typically require operational amplifiers (opamps) characterized by low noise, low offset, low offset drift, and low distortion in a frequency band of interest. One particular opamp design that meets these requirements is the multipath feed-forward opamp. This design provides high loop gain in a given frequency band and a very low corresponding unity gain crossover frequency. In particular, the high open loop gain minimizes distortion in the output signal. Furthermore, using relatively simple amplifier stages, conditionally stable multipath feed-forward amplifiers can be constructed which support high current loads (capacitive or resistive) while still maintaining stability and high output linearity.

The typical multipath feed-forward opamp is based on a cascade of integrator stages, all of which contribute to the open loop gain at low frequencies. At high frequencies, only the last stage, which is designed to have the highest bandwidth, remains in the signal path. During the transition from low to high frequencies, the integrator stages are bypassed, one at a time, until only the final stage is driving the output.

Depending on the particular multipath feed-forward opamp design, certain integrator stages in the cascade receive multiple input signals. These input signals may come, for example, from one or more prior stages in the cascade, or directly from the opamp external input. Those integrator stages that receive multiple input signals then internally sum the received signals with an integral summer circuit.

One significant problem found in present multipath feed-forward opamps comes from variations in the common mode voltage at the opamp external input. Specifically, inputs of those integrator stages that are directly coupled to the opamp external input are exposed to any variations in common mode voltage. The result is increased complexity in the design and/or reduced input voltage swing. Additionally, an increase in power consumption may result.

In multipath feed-forward amplifiers used in precision applications, such as instrumentation systems, minimal output signal distortion is a critical operational characteristic. For a given power consumption level, a maximum signal to distortion ratio in the frequency band of interest is a highly desired feature. To this end, the problem of minimizing the effects of variations in the common mode voltage at the inputs to the integrator stages must be addressed.

SUMMARY OF INVENTION

The principles of the present invention are embodied in a feed-forward operational amplifier including a dedicated summer circuit for summing a signal generated by a first amplifier stage of the feed-forward amplifier and a signal received from an external source to generate a sum signal and a second amplifier stage coupled to the summer circuit and receiving the sum signal. The second amplifier stage realizes a pole-zero doublet to decrease a unity gain frequency of the feed-forward operational amplifier.

The utilization of a dedicated summer circuit ensures that a given amplifier stage of a feed-forward operational amplifier is relatively immune to variations in the common mode voltage of an input signal fed-forward to that amplifier stage. Realizing pole-zero doublet in at least the output stage of the operational amplifier lowers the unity gain frequency and hence reduces power consumption. Additionally, replica biasing may be used in the dedicated summer to increase input common mode range, while still allowing the amplifier stage to implement a pole-zero doublet. Advantageously, the inclusion of a pole-zero doublet realizes a significant savings in chip area and power.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
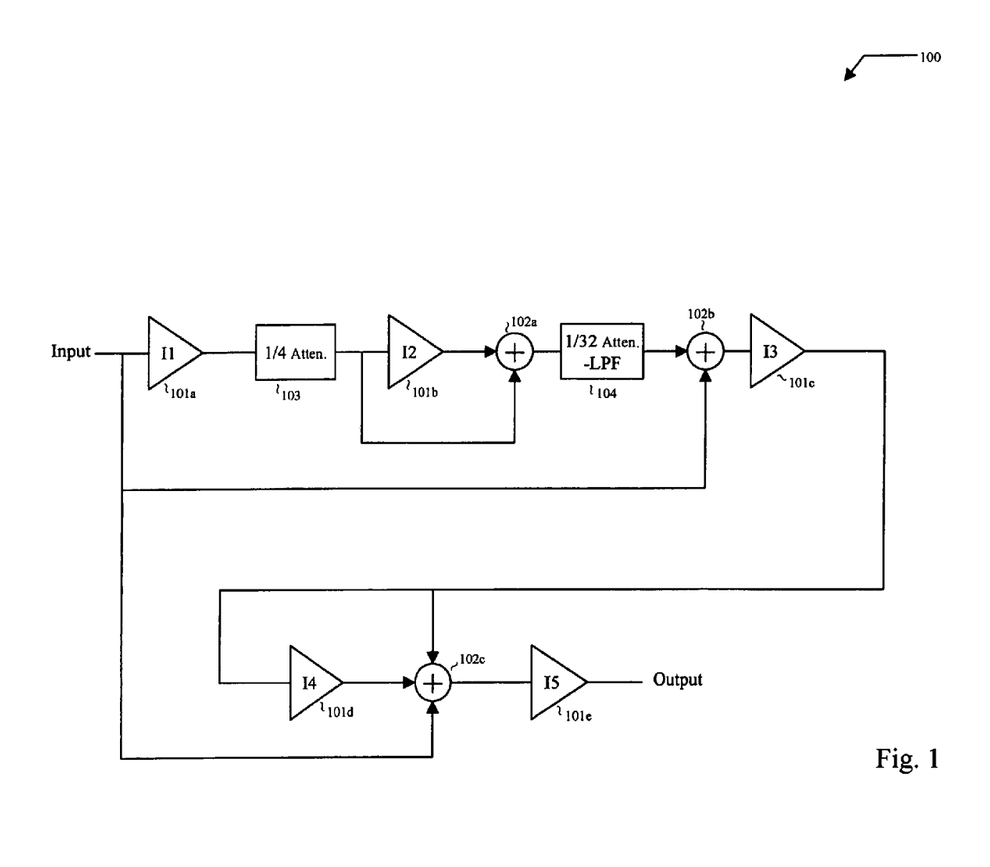
FIG. 1 is a block diagram of a representative feed-forward operational amplifier (opamp) embodying the principles of the present invention.

FIG. 1 is an operational block diagram of a feed-forward operational amplifier (opamp) 100, fabricated on a single chip, and embodying the principles of the present invention. Opamp 100 is based on five (5) integrator stages 101a–101e, three (3) summers 102a–102c an attenuator 103 and an attenuator-low pass filter (LPF) 104.

In structure shown in FIG. 1, first integrator stage 101a receives a single input signal from the opamp 100 external input terminal INPUT. The external input signal INPUT is also fed-forward to third integrator stage 101c and fifth integrator stage (15) 101e. In addition, third integrator stage 101c receives the sum of the outputs of first integrator stage 101a and second integrator stage 101b generated by summer 102a. Fifth integrator stage 101e receives additional input signals from third integrator stage 101c and fourth integrator stage 101d. The multiple signals fed-forward to third and fifth integrator stages 101c and 101e are summed with separate (independent) summers 102b and 102c, respectively.

Second integrator stage 101b and fourth integrator stage 101d each receive only one signal, respectively from first integrator stage 101a and third integrator stage 101c. Fifth integrator stage 101e drives the opamp output terminal OUTPUT.

The common mode voltage at the inputs to second and fourth integrator stages 101b and 101d are well controlled by the design of the interface with the preceding first and third integrator stages 101a and 101c. However, controlling the common mode voltages at the inputs to first integrator stage 101a, third integrator stage 101c, and fifth integrator stage 101e is more difficult, since each of these stages receives an input signal directly from the opamp external input. In particular, the common mode voltage input signal received at the opamp external input can vary significantly, for example due to a time-varying voltage on the common (ground) line. In specific regards to third and fifth integrator stages 101c and 101e, the possible wide range of variation in the common mode voltage makes the required signal summation at the corresponding inputs difficult and non-optimum.

Feed-forward opamp 100 is also only conditionally stable. Specifically, feed-forward opamp 100 is only stable for a certain range of feedback factors within integrator stages 101a–101e. Consequently, the closed loop gain range for feed-forward opamp 100 is restricted, which in turn reduces the useful dynamic range of the input signal at the opamp external input terminal INPUT. For a given input signal bandwidth, the closed loop gain can be improved by either increasing the bandwidth of fifth integrator stage 101e and/or by increasing the order of opamp 100 (i.e. adding additional integrator stages 101 to the cascade). Utilizing either of these techniques, however, consumes additional die area, requires additional power, or both.

Designing a pole-zero doublet into the frequency response of an integrator stage opamp circuit reduces power consumption by significantly reducing the opamp unity gain frequency, especially when implemented in fifth integrator stage 101e. A Bode plot illustrating the effects of a pole-zero doublet on the frequency response of an exemplary amplifier is provided in FIG. 2A, in which $f_p$ is the frequency of the pole, $f_z$ is the frequency of the zero, $f_c$ is the unity gain crossover frequency and $f_c'$ is the unity gain frequency of the amplifier if the pole-zero doublet had not been realized.

Figure 2A:
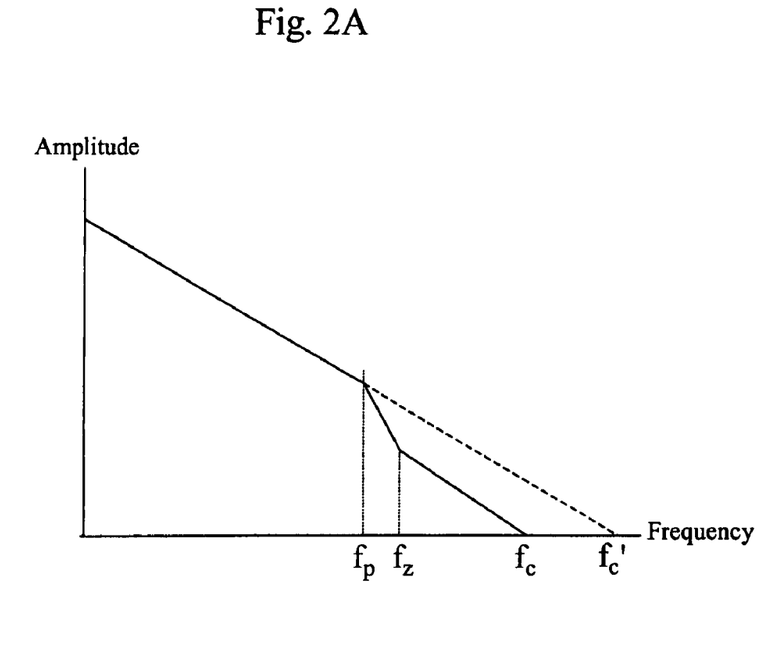
FIG. 2A is a Bode plot illustrating the effect on the output frequency response of an amplifier of realizing a pole-zero doublet.
Figure 2B:
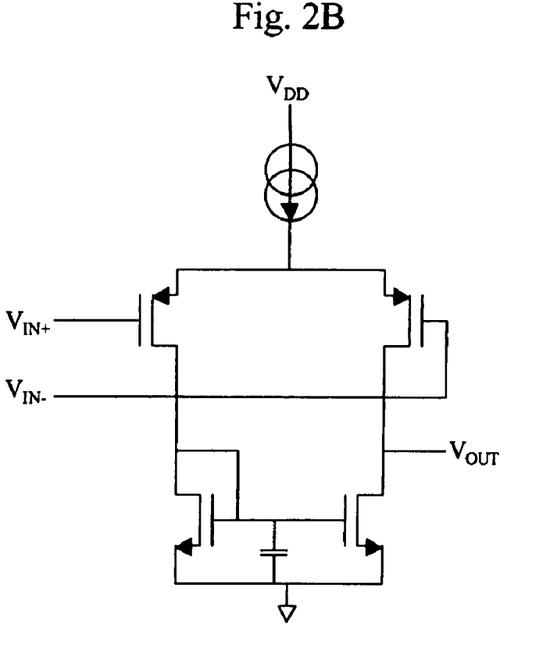
FIG. 2B is an electrical schematic diagram of a representative amplifier realizing a pole-zero doublet.
Figure 3A:
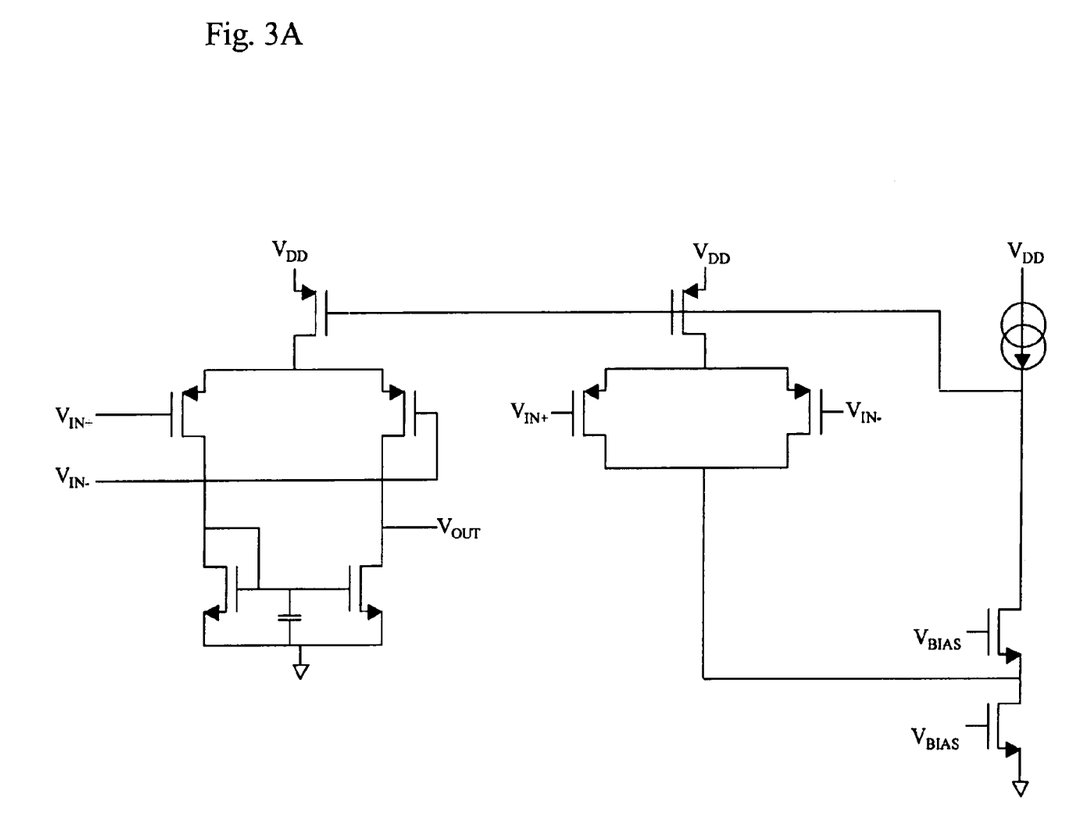
FIG. 3A is an electrical schematic diagram of an exemplary amplifier utilizing replica biasing.

Generally, a pole-doublet may be realized by adding a shunt capacitor, at the gate of a current mirror controlling the integrator stage differential transistor pair, to move the natural pole of the current mirror into the signal band. FIG. 2B is an electrical schematic diagram of a representative amplifier utilizing this technique. However, introducing a zero-pole doublet into a integrator stage opamp circuit can conflict with other design goals, such as setting a wide integrator stage common mode input range to accommodate variations in the common mode voltage. For example, one technique, which could be used for increasing the input common mode range of fifth integrator stage 101a and/or third integrator stage 10b, is replica biasing. FIG. 3A is an electrical schematic diagram of an exemplary amplifier with replica biasing for common mode feedback. On the other hand, if zero-pole doublet is designed into an integrator stage including replica biasing, instability can result.

Figure 3B:
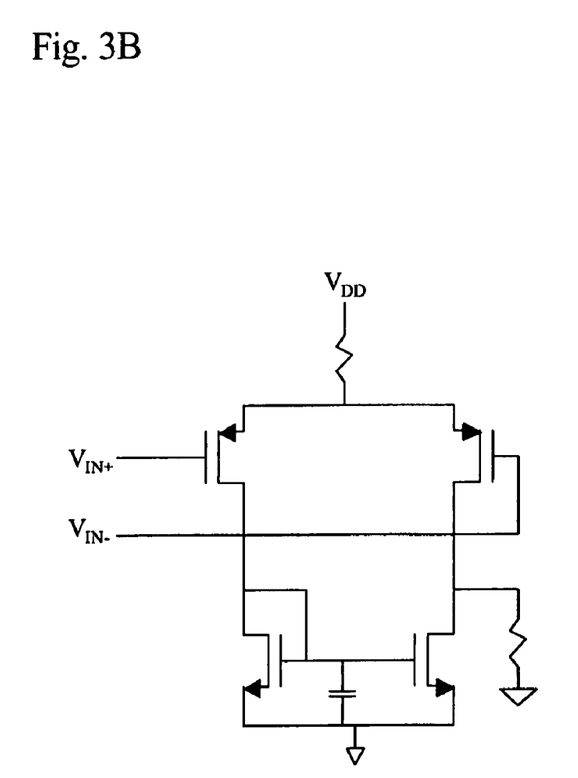
FIG. 3B is an electrical schematic illustrating the effect of utilizing replica biasing in conjunction with the amplifier shown in FIG. 2B.

Generally, for a differential pair amplifier having a current mirror load and an ideal tail current source, the zero of the pole-zero doublet follows the pole at a higher frequency, depending on the current split between the shunt capacitor and the output load. The resulting reduced phase margin may cause instability. Furthermore, if replica biasing is utilized as the current source to allow high common mode operation, the tail current biasing the differential pair becomes resistive (i.e. non-ideal). FIG. 3B illustrates this effect of replica biasing on the exemplary amplifier shown in FIG. 2B. In particular, in a replica-biasing scheme, the tail current source may operate well into the triode or linear operating regions and therefore may have a very low output impedance. Consequently, the differential amplifier transistor pair may unevenly split the current between the shunt capacitor and the output load. When the current through the shunt capacitor exceeds the current through the output load, the zero of the pole-zero doublet moves to a higher frequency, depending on the amount of current actually sourced into the output load. A high frequency zero results in instability of the amplifier.

Summers 102b and 102c utilize either replica biasing or traditional current mirror source biasing, allowing an increased common mode input range to account for common mode input variations in the input signal INPUT. The problem of a tail current source operating in the linear region is eliminated, since summers 102b–102c operate with a substantially higher current density.

Pole-zero doublets are then designed into third integrator stage 102c and/or fifth integrator stage 102e, to reduce power and chip area. Advantageously, with the replica biasing or traditional current mirror biasing circuitry disposed in independent summers 102b–102c, third and fifth integrator stages 101c and 101e are stable.

Figure 4:
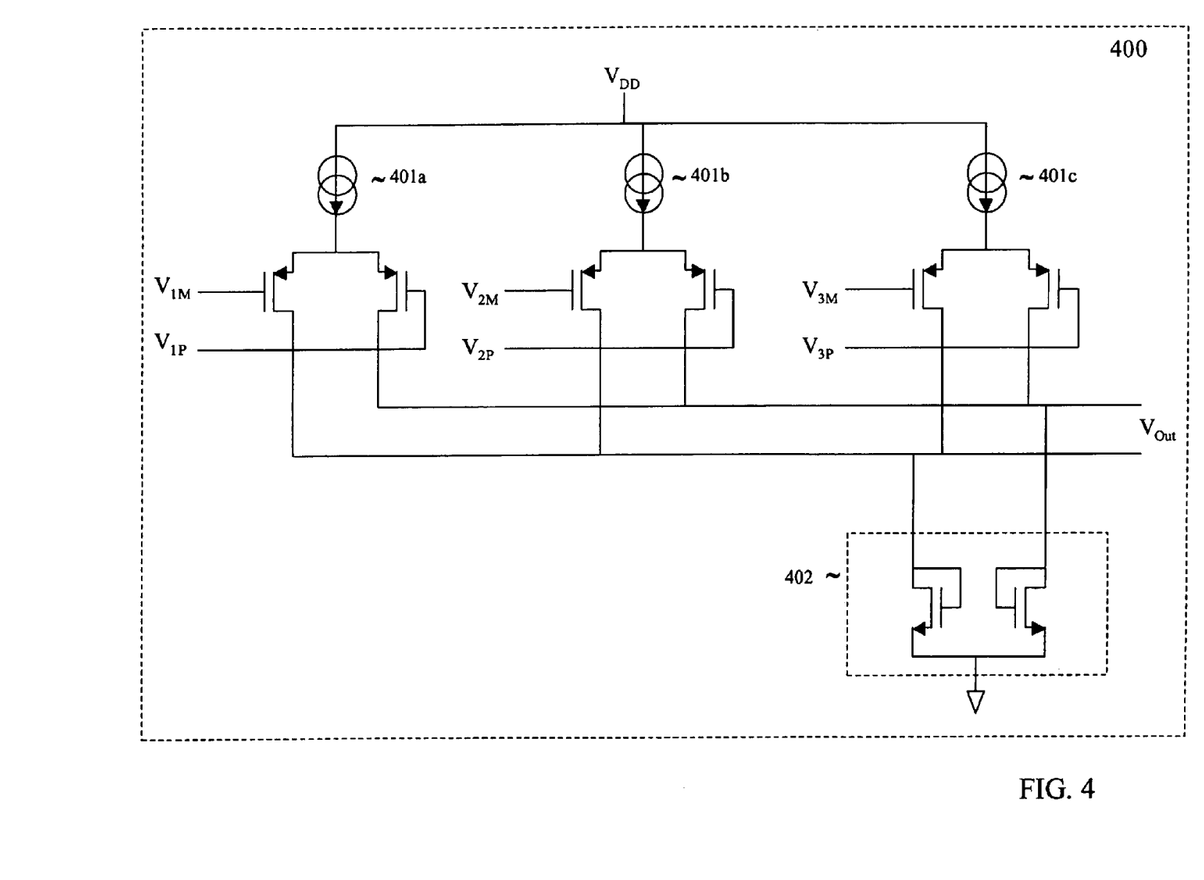
FIG. 4 is an electrical schematic of an exemplary summer circuit suitable for use in one or more of the independent summer blocks shown in FIG. 4.

FIG. 4 is an electrical schematic of an exemplary three-signal summer circuit 400 suitable for utilization in summer 102c of FIG. 1. A similar two-input embodiment of summer circuit 300 is suitable for utilization in summer 102b. In the illustrated embodiment, biasing is provided by replica bias tail current sources 401a–401c and current mirror 402.

Figure 5:
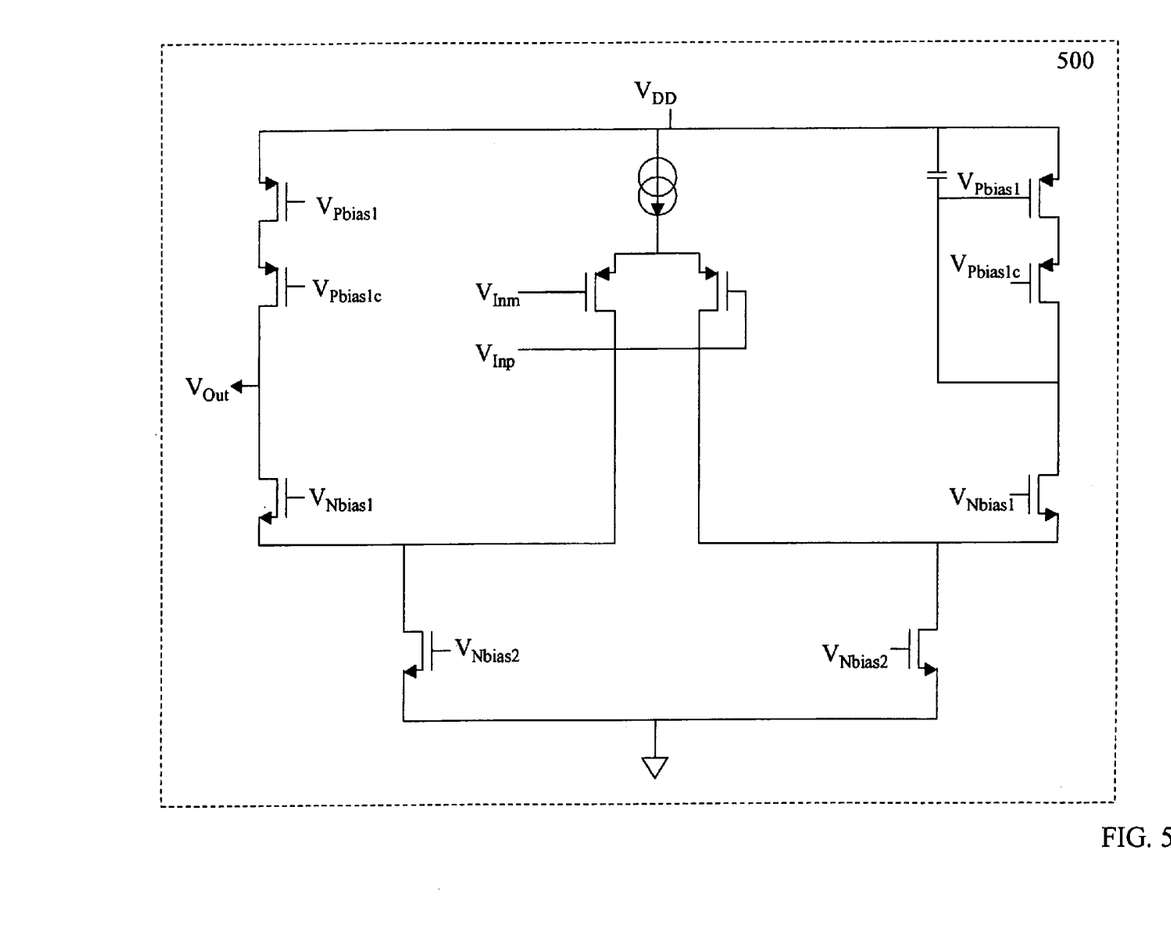
FIG. 5 is an electrical schematic of an exemplary integrator circuit realizing a pole-zero doublet and suitable for use in one or more of the integrator stages shown in FIG. 1.

FIG. 5 is an electrical schematic of a representative integrator stage 500 suitable for utilization as third integrator stage 101c and/or fifth integrator stage 101e. Advantageously, integrator stage 500 realizes a pole-zero doublet that reduces power consumption and saves die area.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A feed-forward operational amplifier comprising:
   a dedicated summer circuit for summing a signal generated by a first amplifier stage of a feed-forward amplifier and a signal received from an external source to generate a sum signal; and
   a second amplifier stage coupled to the summer circuit and receiving the sum signal generated by the summer by summing the signal generated by the first stage and the signal received from the external source, the second amplifier stage realizing a pole-zero doublet to decrease a unity gain frequency of the feed-forward operational amplifier, wherein a common mode input voltage range of the dedicated summer is selected to account for common mode input voltage variations in the signal received from the external source to maintain stability of the second amplifier stage.

2. The feed-forward operational amplifier of claim 1, wherein the second stage drives an output terminal of the feed-forward operational amplifier.

3. The feed-forward operational amplifier of claim 1, wherein the second stage drives an input terminal of a third stage of the feed-forward operational amplifier.

4. The feed-forward operational amplifier of claim 1, wherein the summer includes a current mirror biasing circuit.

5. The feed-forward operational amplifier of claim 4, wherein the current mirror biasing circuitry is sourced by a replica biasing circuit.

6. The feed-forward operational amplifier of claim 1, wherein the second amplifier comprises a current mirror and a shunt capacitor controlling a differential transistor pair for realizing the pole-zero doublet.

7. The feed-forward amplifier of claim 1, wherein the first amplifier stage realizes a pole-zero doublet.

8. A method of operating a feed-forward operational amplifier, comprising:
   independently summing, in a dedicated summer, a signal generated by a first amplifier stage of a feed-forward operational amplifier and a signal received from an external source to generate a sum signal;
   presenting the sum signal to a second amplifier stage of the feed-forward operational amplifier, the second amplifier stage realizing a pole-zero doublet to decrease a unity gain frequency of the feed-forward operational amplifier; and
   controlling a common mode input range of the dedicated summer to account for common mode input variations in the signal received from the external source to maintain stability of the second amplifier stage.

9. The method of claim 8, further comprising driving an output of the operational amplifier with an output of the second amplifier stage.

10. The method of claim 8, further comprising driving an input of a third amplifier stage with an output of the second amplifier stage.

11. The method of claim 8, wherein independently summing comprises summing the signal generated by the first amplifier stage and the signal received from an external source comprises summing in a dedicated summing circuit including a current mirror load.

12. The method of claim 8, wherein independently summing comprises summing the signal generated by the first amplifier stage and the signal received from an external source comprises summing in a dedicated summing circuit including replica biasing.

13. The method of claim 8, wherein the second amplifier stage realizes a pole-zero doublet with a current mirror and shunt capacitor controlling a differential transistor pair.

14. A feed-forward operational amplifier comprising:
    a dedicated summer circuit for summing an internally-generated signal with an externally-generated input signal to generate a sum signal; and
    an output integrator stage realizing a pole-zero doublet for generating a feed-forward operational amplifier output signal from the sum signal generated by the dedicated summer, wherein a common mode input voltage range of the dedicated summer is selected to account for common mode input voltage variations in the externally-generated signal to maintain stability of the output integrator stage.

15. The feed-forward operational amplifier of claim 14, further comprising a second integrator stage for generating the internally-generated signal from second internally-generated signal.

16. The feed-forward operational amplifier of claim 15, further comprising a second dedicated summer circuit for generating the second internally-generated signal by summing a third internally-generated signal and the externally-generated signal.

17. The feed-forward operational amplifier of claim 15, wherein the dedicated summer sums the internally-generated signal, the externally-generated signal, and an another internally-generated signal.

18. The feed-forward operational amplifier of claim 15, wherein the second integrator stage realizes a pole-zero doublet.

19. The feed-forward operational amplifier of claim 15, wherein the dedicated summer includes a replica biasing current source.

20. The feed-forward operational amplifier of claim 15, wherein the output integrator stage includes a differential transistor pair controlled by a current mirror and a shunt capacitor for realizing the pole-zero doublet.

* * * * *

UNITED STATES PATENT AND TRADEMARK OFFICE
CERTIFICATE OF CORRECTION

PATENT NO.         : 7,106,132 B1                                        Page 1 of 1
APPLICATION NO.    : 10/974339
DATED              : September 12, 2006
INVENTOR(S)        : Murari Kejariwal and Ammisetti Prasad It is certified that error appears in the above-identified patent and that said Letters Patent is hereby corrected as shown below:

On title page item (75)
Page 1, the first inventor's name is misspelled. "Muari Kewariwal" should be --Murari Kejariwal--.

Signed and Sealed this

Fifth Day of December, 2006

JON W. DUDAS
*Director of the United States Patent and Trademark Office*